United States Patent [19]

Park

[11] Patent Number: 5,648,289

[45] Date of Patent: Jul. 15, 1997

[54] METHOD FOR CODING SEMICONDUCTOR READ ONLY MEMORY DEVICE

[75] Inventor: Soung Hwi Park, Kyungsangbuk-do, Rep. of Korea

[73] Assignee: LG Semicon Co., Ltd., Chungcheongbuk-do, Rep. of Korea

[21] Appl. No.: 447,609

[22] Filed: May 23, 1995

[30]     Foreign Application Priority Data

Jun. 30, 1994 [KR] Rep. of Korea .................. 94-15409

[51] Int. Cl.⁶ .................. H01L 21/265; H01L 27/00; H01L 21/70
[52] U.S. Cl. .................. 437/48; 437/49; 437/52
[58] Field of Search .................. 437/43, 45, 48, 437/49, 52

[56]         References Cited

U.S. PATENT DOCUMENTS

| | | | |
|---|---|---|---|
| 4,517,732 | 5/1985 | Oshikawa | 437/43 |
| 4,608,748 | 9/1986 | Noguchi et al. | 437/48 |
| 4,720,323 | 1/1988 | Sato | 437/43 |
| 5,331,590 | 7/1994 | Josephson et al. | 257/314 |
| 5,422,296 | 6/1995 | Lage | 437/56 |
| 5,453,392 | 9/1995 | Hong et al. | 437/49 |

*Primary Examiner*—John Niebling
*Assistant Examiner*—Brian K. Dutton

[57]         ABSTRACT

A method for coding a semiconductor ROM. The method includes the steps of: carrying out a local oxidizing process on a semiconductor substrate to separate the substrate into field regions and active regions; forming a gate insulating layer; depositing a polysilicon layer; and patterning the structure by applying a photo etching process to form a polysilicon gate only on a portion where an enhancement transistor is to be formed. Further, impurity ions are ion-implanted into a source/drain region by utilizing a gate of an enhancement transistor as a mask, and simultaneously, impurity ions are ion-implanted into a region where a drain, a gate and a source of a depletion transistor are to be formed, whereby n type impurity layers of the same depth are formed to interconnect them.

6 Claims, 3 Drawing Sheets

METHOD FOR CODING SEMICONDUCTOR READ ONLY MEMORY DEVICE

FIELD OF THE INVENTION

The present invention relates to a method for coding a read only memory (ROM), and more particularly to a method for coding a semiconductor read only memory device, in which the process is simplified, and the recognition of the ROM codes is made easy.

DESCRIPTION OF THE PRIOR ART

Conventionally there has been used a method in which the cells corresponding to ROM codes are made in the form of depletion transistors, thereby carrying out a coding.

FIG. 1 is a perspective view of a part of a ROM which is manufactured based on the conventional method.

In the coding method for the conventional ROM, a local oxidizing (LOCOS) process is carried out on a semiconductor substrate 10 so as to separate it into an active region 15 and a field region 16 having a gate oxide layer 19 and a field oxide 18, respectively.

Then photoresist is spread, and then, an exposure and development are carried out. Then a photoresist mask pattern is formed for forming an impurity ion implantation layer on a channel region 14 in which a depletion type transistor is to be formed at a subsequent step.

Then, by using this photoresist mask pattern, an ion implantation is carried out to form a depletion ion implantation layer at a part of the active region 15. That is, the transistor, which is to be formed on the ion implantation layer which is to be formed at a subsequent step, is a depletion type transistor. Meanwhile, the transistor which is to be formed in a region in which there is no ion implantation layer is an enhancement transistor.

Generally, the impurity ions which are for forming a depletion channel region with a P type substrate used are n type ions, while the impurity ions which are for forming source and drain regions are also n type ions. After the completion of the ion implantation, the photoresist layer is removed.

Then a polysilicon layer is deposited, and then, photoresist is spread. Then an exposure and a development are carried out to define a region on which a polysilicon gate 17 is to be formed. Then the polysilicon layer is etched to form the gate 17. The polysilicon gate 17 is formed in such a manner as to cross the active region and the field region.

Then a high concentration n type impurity is ion-implanted to form source and drain regions 11, 12 and 13 of transistors.

Then, an HLD (high temperature low pressure dielectric) is used to deposit an inter-layer dielectric, and a BPSG is deposited thereupon. Then there are carried out the general finishing steps such as flattening of the cells.

Meanwhile, in the depletion transistor, a thin channel is formed on the depletion ion implanted layer, and the transistor is maintained in a turned-on state regardless of whether the voltage of the polysilicon gate is high or low. On the other hand, in the enhancement transistor, if a low voltage is supplied to the gate, the transistor is turned off, while, if a high voltage is supplied to the gate, the transistor is turned on.

By utilizing this feature, in order to read out the coded data, a high voltage is supplied to the peripheral gates (word line) so as to turn on all the transistors. Meanwhile, a low voltage is supplied to the gate of the transistor from which a data is to be read out, thereby reading the data through a bit line. The bit line is formed such that an active region between field regions serves as the bit line. If the relevant cell is turned on, then the transistors of the bit line are all put to a turned-on state, and therefore, they transmit a voltage like a connected line. If the relevant cell is in a turned-off state, the bit line is in a broken state, so that the bit line cannot transmit data.

In the above described conventional technique, the operational differences between the enhancement transistor and the depletion transistor are utilized. That is, the depletion transistor has a large resistance compared with the enhancement transistor, and therefore, the conventional device is slow in its operation speed.

Further, after the depletion ion implantation, the ion implanted position cannot be discriminated, and therefore, the codes are mixed during the process.

SUMMARY OF THE INVENTION

The present invention is intended to overcome the above described disadvantages of the conventional technique.

Therefore, it is the object of the present invention to provide a method for coding a semiconductor ROM, in which high concentration impurity ions are implanted into a channel of a depletion transistor so as to decrease the resistance during the operation of the cell, and a source/drain forming ion implantation and a ROM coding ion implantation are simultaneously carried out by utilizing the gate of an enhancement transistor as a mask, so that the manufacturing process would be simplified, that the coded state can be recognized during the manufacturing process, and that the operation speed of the transistor can be made fast.

In achieving the above object, the method for coding a semiconductor ROM according to the present invention includes the steps of: carrying out a local oxidizing process on a semiconductor substrate to separate the substrate into field regions and active regions; forming a gate insulating layer; depositing a polysilicon layer; and patterning the structure by applying a photo etching process to form a polysilicon gate only on a portion where an enhancement transistor is to be formed.

Further, impurity ions are ion-implanted into a source/drain region by utilizing a gate of an enhancement transistor as a mask, and simultaneously, impurity ions are ion-implanted into a region where a drain, a gate and a source of a depletion transistor are to be formed, whereby n type impurity layers of the same depth are formed to inter-connect them.

The method according to the present invention further includes the steps of: depositing a polysilicon layer, and patterning it to form a polysilicon gate, this gate being overlapped with the already formed gate over the gate of the enhancement transistor.

In the ROM device of the present invention in which a plurality of ROM cells are provided by forming enhancement transistors and depletion transistors, conductive layers are provided in a dual form only on the gate of the enhancement transistor, while the channel region of the depletion transistor is doped with the same conduction type impurity as that of the source and drain with the same depth.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENTS

Figure 1:
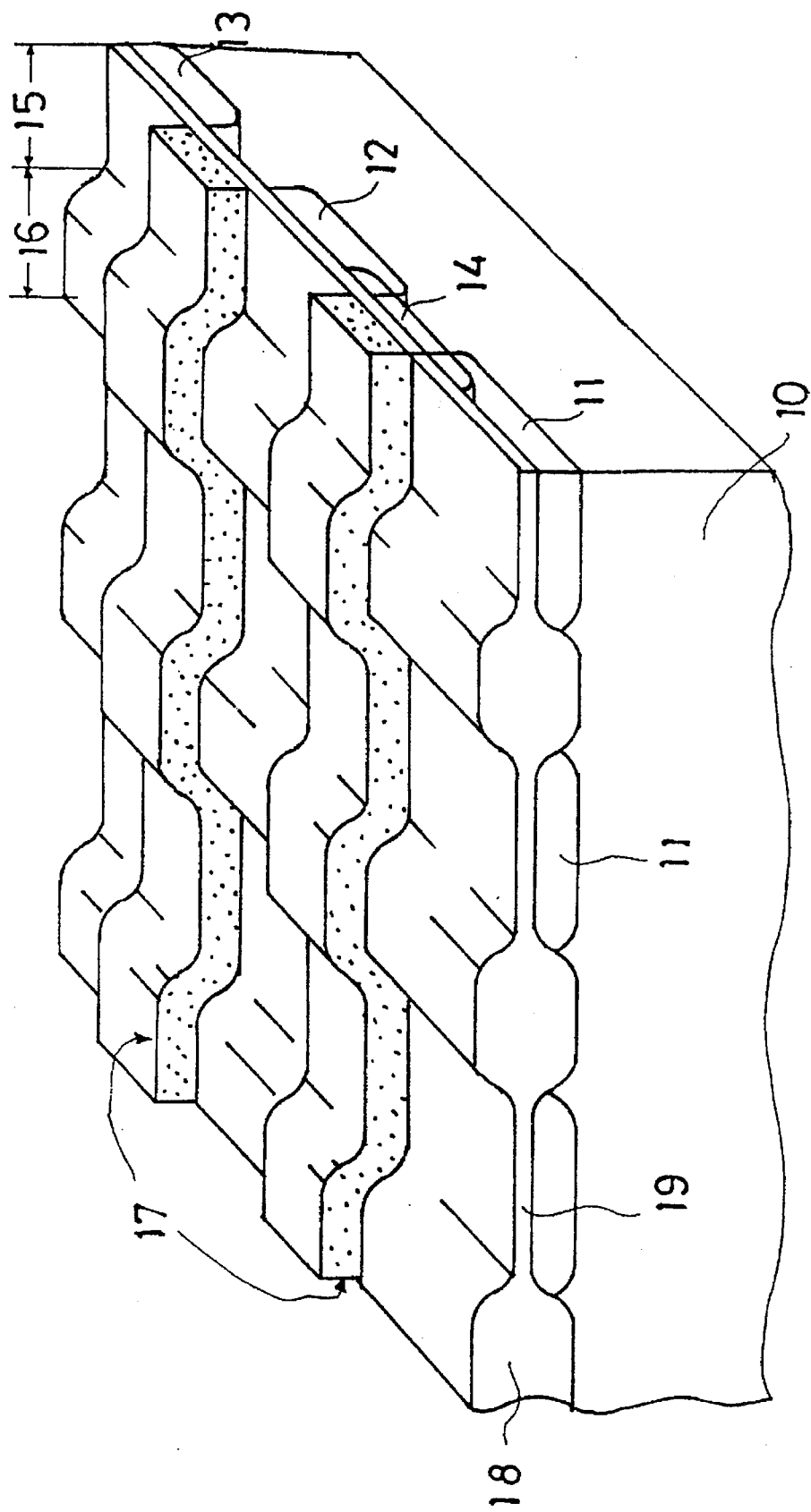
FIG. 1 is a perspective view of a conventional ROM for explaining a conventional method for coding a ROM.
Figure 2A:
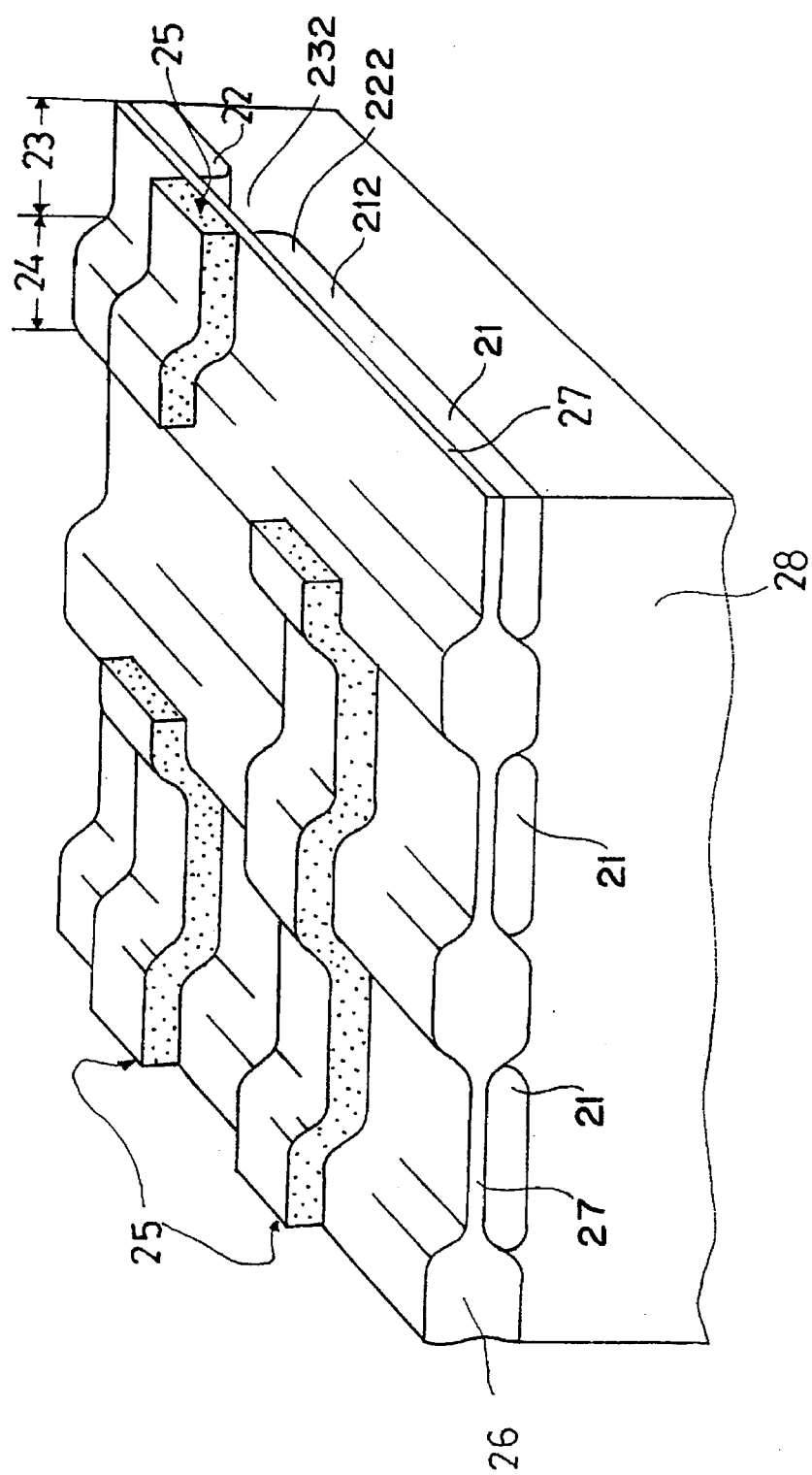
FIG. 2(A) is a perspective view of a ROM for explaining a method for utilizing a polysilicon layer in coding the ROM according to the embodiments of the present invention.
Figure 2:
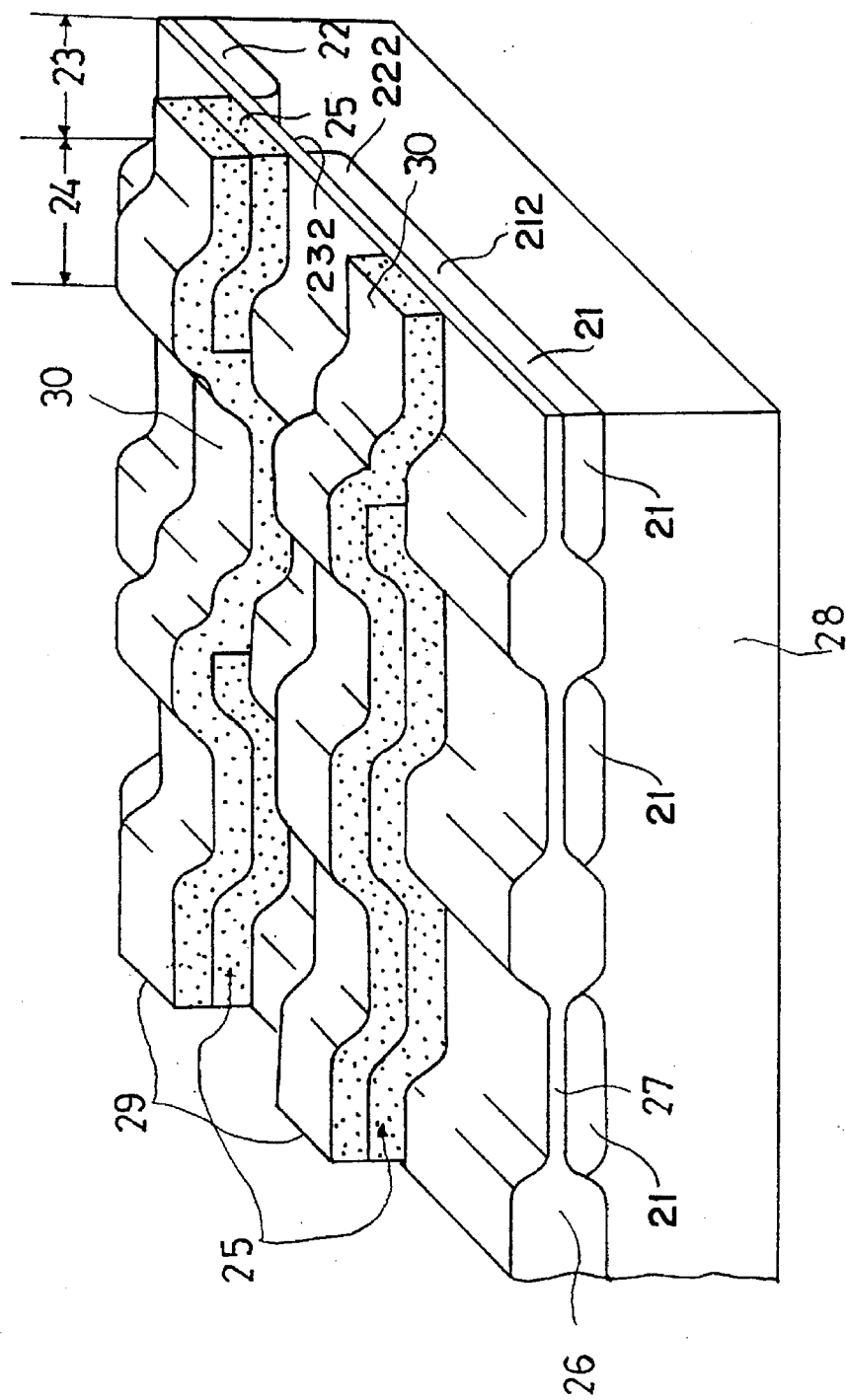
FIG. 2(B) is a perspective view of the ROM for explaining the method for coding the ROM according to the embodiments of the present invention.

FIGS. 2A and 2B are perspective views showing a part of a ROM which is in the process of being manufactured, for explaining a method for coding a ROM according to the present invention.

First, as shown in FIG. 2A, a local oxidizing process is carried out on a semiconductor substrate 28 to form an active region 23 and a field region 24. A gate oxide layer 27 is formed on the active region 23.

Then polysilicon is deposited to form a polysilicon layer on the whole surface, and then, photoresist is spread. Then the photoresist film is exposed and developed, and a photoresist mask pattern is formed, thereby defining a region in which a polysilicon gate 25 of an enhancement transistor is to be formed.

Then the polysilicon layer is etched by using the photoresist mask pattern as an etch mask to form the polysilicon gate 25, leaving only the region in which the gate 25 of the enhancement transistor is to be formed.

Then an impurity ion implantation is carried out by utilizing a thick oxide layer 26 (field region) as a mask and by utilizing the polysilicon gate 25 of the enhancement transistor as a mask.

Under this condition, the channel region 212 which lies under the gate of the depletion transistor is simultaneously ion-implanted, with the result that the drain 21, source 222 and channel 212 regions of the depletion transistor are formed, these ion-implanted regions having the same depth.

A channel region 232 under the polysilicon gate 25 of the enhancement transistor is not ion-implanted, so the enhancement transistor comprising a source 222, a drain 22, a gate oxide 27 and a gate electrode 25 is formed. The ion-implanted regions 21, 222, 22 function as source and/or drain during a depletion and/or enhancement transistor's operation.

Then as shown in FIG. 2B, polysilicon is deposited to form a polysilicon layer.

Then photoresist is spread on the whole surface, and an exposure and a development are carried out, thereby forming a mask pattern. This mask pattern is for defining gate lines 29 and 30 of the respective transistors.

Then the polysilicon layer is etched by using the mask pattern as a mask so as to form the gate lines 29 and 30.

The gate 29 of the enhancement transistor is formed on the polysilicon gate 25 which has been formed first.

Meanwhile, the polysilicon gate line 30 of the depletion transistor is formed upon the gate oxide layer 27 which has been formed upon the channel.

Then an inter-layer dielectric is deposited by applying an HLD (high temperature low pressure dielectric) process, and then, a BPSG is deposited thereupon. Then the general steps are carried out such as flattening and the like.

In the above described process, in the case where a p type substrate is used, n type impurity ions are used.

According to the present invention as described above, the resistance of the depletion transistor is decreased, thereby greatly improving the operating speed of the device.

Further, a checking can be made as to whether an impurity is ion-implanted or not, by observing the height of the polysilicon gate electrode. Therefore, even when various kinds of codes are formed, the ROM data can be easily read, with the result that the productivity is improved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for coding a semiconductor ROM, comprising the steps of:

forming field regions and active regions on a substrate;

forming a gate insulating layer on the active regions;

forming a polysilicon-gate layer on a portion of the gate insulating layer where an enhancement transistor is to be formed;

carrying out an ion-implementation to form a source and a drain of the enhancement transistor, and to form a source, a drain and a channel region of a depletion transistor by utilizing said polysilicon-gate layer as a mask; and forming a gate line of said enhancement transistor on the polysilicon gate layer, and forming a gate line of said depletion transistor on the gate insulating layer, said gate line of said depletion transistor extending from said gate line of said enhancement transistor.

2. A method as in claim 1, wherein:

said channel region of said depletion transistor has a depth same as that of said drain and source of said depletion transistor.

3. A method as in claim 1, wherein said field regions are formed by an oxidation process and a photolithography process.

4. A method as in claim 1, wherein said field regions are formed by a local oxidizing process.

5. A method as in claim 4, wherein said gate insulating layer is formed by an oxidation process.

6. A method as in claim 5, wherein said step of forming the polysilicon-gate layer includes the steps of:

depositing a polysilicon layer on the gate insulating layer and the field regions, and patterning the polysilicon layer by applying a photo etching process.

* * * * *